(12) United States Patent
Chen

(10) Patent No.: US 7,777,237 B2
(45) Date of Patent: Aug. 17, 2010

(54) SEMICONDUCTOR LIGHT-EMITTING DEVICE AND METHOD OF FABRICATING THE SAME

(75) Inventor: Jen-Shyan Chen, Hsinchu (TW)

(73) Assignee: Neobulb Technologies, Inc. (BN)

( * ) Notice: Subject to any disclaimer, the term of this patent is extended or adjusted under 35 U.S.C. 154(b) by 188 days.

(21) Appl. No.: 11/921,176

(22) PCT Filed: May 31, 2006

(86) PCT No.: PCT/CN2006/001165
§ 371 (c)(1),
(2), (4) Date: Nov. 28, 2007

(87) PCT Pub. No.: WO2006/128375
PCT Pub. Date: Dec. 7, 2006

(65) Prior Publication Data
US 2009/0101932 A1 Apr. 23, 2009

(30) Foreign Application Priority Data
May 31, 2005 (CH) .......................... 2005 1 0074731

(51) Int. Cl.
*H01L 27/15* (2006.01)
*H01L 23/29* (2006.01)
(52) U.S. Cl. .............. 257/81; 257/79; 257/99; 257/100; 257/E33.059; 257/E33.056; 257/E33.065; 257/E33.072
(58) Field of Classification Search .......... 257/79, 257/81, 99, 100, E33.059, E33.065, E33.072
See application file for complete search history.

(56) References Cited

U.S. PATENT DOCUMENTS 6,707,166 B1 * 3/2004 Noguchi ............ 257/790
2004/0173810 A1 9/2004 Lin et al.

FOREIGN PATENT DOCUMENTS

| CN | 1436374 A | 12/2001 |
|---|---|---|
| CN | 1466782 A | 8/2002 |
| CN | 2612075 Y | 2/2003 |
| CN | 1538538 A | 4/2004 |
| JP | 2004260048 A2 | 2/2003 |
| TW | M261835 | 7/2004 |

OTHER PUBLICATIONS

JP 2003-046135, Kawahara et al., Semiconductor Light Emitting Device, Feb. 14, 2003, English translation.*
International Search Report of PCT/CN2006/001165 dated Aug. 10, 2006.

* cited by examiner

*Primary Examiner*—Dao H Nguyen
(74) *Attorney, Agent, or Firm*—Thomas, Kayden, Horstemeyer & Risley, LLP.

(57) ABSTRACT

The invention provides a semiconductor light-emitting device package structure. The semiconductor light-emitting device package structure includes a substrate, N sub-mounts, and N semiconductor light-emitting die modules, wherein N is a positive integer lager than or equal to 1. Each of the sub-mounts is embedded on the substrate and exposed partially. Each of the semiconductor light-emitting die modules is mounted on the exposed surface of one of the sub-mounts.

7 Claims, 4 Drawing Sheets

SEMICONDUCTOR LIGHT-EMITTING DEVICE AND METHOD OF FABRICATING THE SAME

BACKGROUND OF THE INVENTION

1. Field of the Invention

The present invention is related to a semiconductor light-emitting device package structure, and more particularly, to a multi-chip module single package structure for semiconductor light-emitting dies.

2. Description of the Prior Art

Because of the advantages of long life span, light weight, low power consumption, and absence of mercury, semiconductor light-emitting devices, such as light-emitting diode (LED), has become an ideal light source, and it has been greatly developed. LED can be applied in many fields, including information, communication, consumer electronics, vehicles, traffic light, billboard, and illumination market.

However, current high power semiconductor light emitting devices face a problem of overheating after continued lighting for a period. Furthermore, current semiconductor light-emitting device package structures generally face the problem of exceeding heat resistance, which affects the power and efficiency of lighting. Therefore, conventional semiconductor light emitting device package structures can not reduce the temperature of the light emitting device by simply providing a heat sink. Accordingly, there is a need to provide a package structure with high heat dissipating efficiency to solve the problem of exceeding heat resistance between the interface of the package structure and the heat dissipating module.

SUMMARY OF THE INVENTION

Accordingly, a scope of the invention is to provide a semiconductor light-emitting device package structure for semiconductor light-emitting dies to solve the problem of the prior art.

In a preferred embodiment, a semiconductor light-emitting device package structure of the invention includes a substrate, a flat sub-mount, at least one semiconductor light-emitting die module, and a package material. The substrate thereon defines a top surface and a bottom surface, and a first recess is formed on the top surface, and a second recess is formed on the bottom surface. The second recess is passed through and linked together with the first recess. Furthermore, a protrusion is formed on the top surface along the edge of the first recess, and a plurality of outer electrodes are disposed on the top surface. The flat sub-mount is linked to the second recess and thereon defines a respective first surface and a respective second surface. The flat sub-mount is embedded in the second recess such that the first surface of the sub-mount is partially exposed within the first recess. Each of the at least one semiconductor light-emitting die includes a bottom portion and a inter electrode, the at least one semiconductor light-emitting die is mounted to the first surface of the sub-mount partially exposed within the first recess. Additionally, the package material is filled into the protrusion to cover the at least one semiconductor light-emitting die.

The scope of the present invention will no doubt become obvious to those of ordinary skill in the art after reading the following detailed description of the preferred embodiment, which is illustrated in the various FIG.ures and drawings.

BRIEF DESCRIPTION OF THE APPENDED DRAWINGS

DETAILED DESCRIPTION OF THE INVENTION

The present invention is to provide a semiconductor light-emitting device package structure for semiconductor light-emitting dies. The preferred embodiments are disclosed as below.

Figure 1:
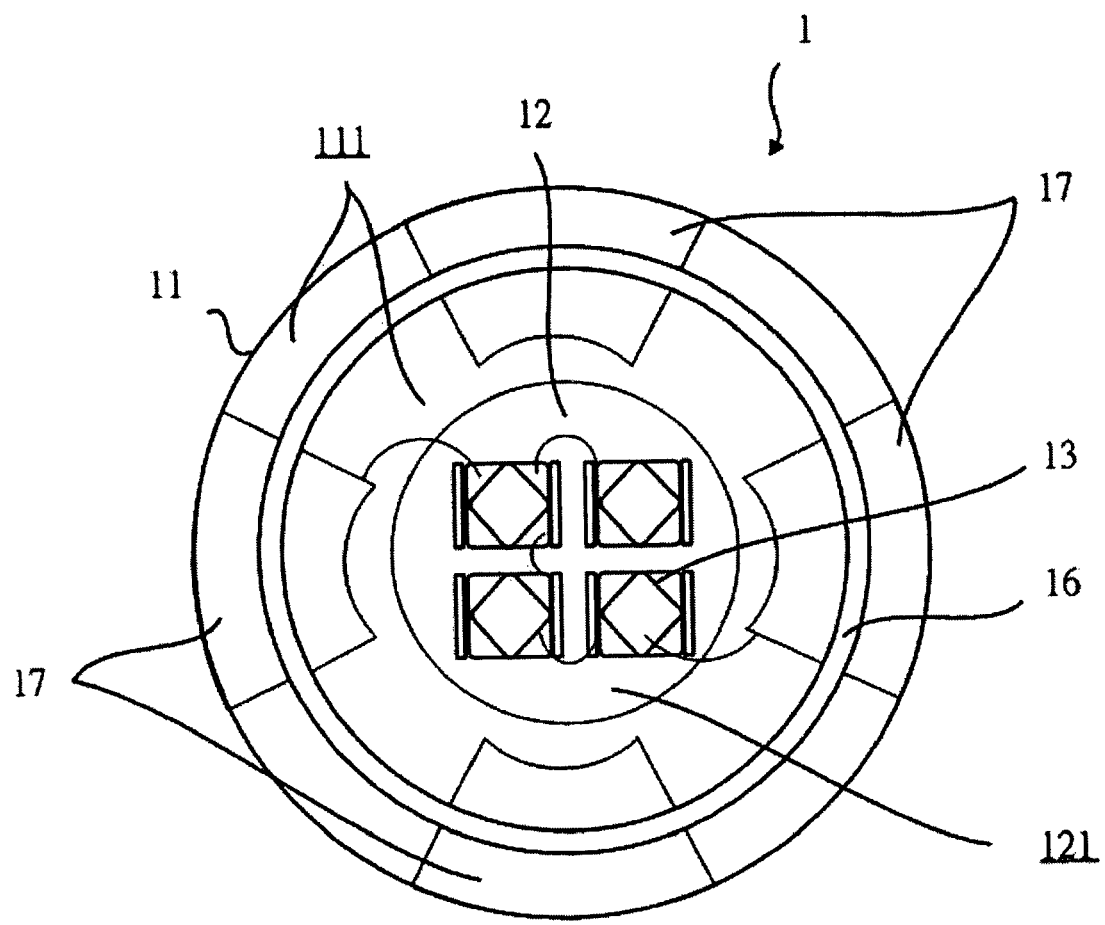
FIG. 1 is a top view of a semiconductor light-emitting device package structure of an embodiment of the invention.

Please refer to FIG. 1, which shows a top view of a semiconductor light-emitting device package structure of an embodiment of the invention. In the embodiment, the semiconductor light-emitting device package structure 1 includes a substrate 11, a sub-mount 12, and at least one semiconductor light-emitting die 13. The substrate has a top surface 111, and a plurality of outer electrodes 17 are disposed on the top surface 111. Furthermore, the sub-mount 12 has a first surface 121, and the at least one semiconductor light-emitting die 13 is mounted to the first surface 121 of the sub-mount 12 via the inter electrode of its bottom surface 131.

Figure 2:
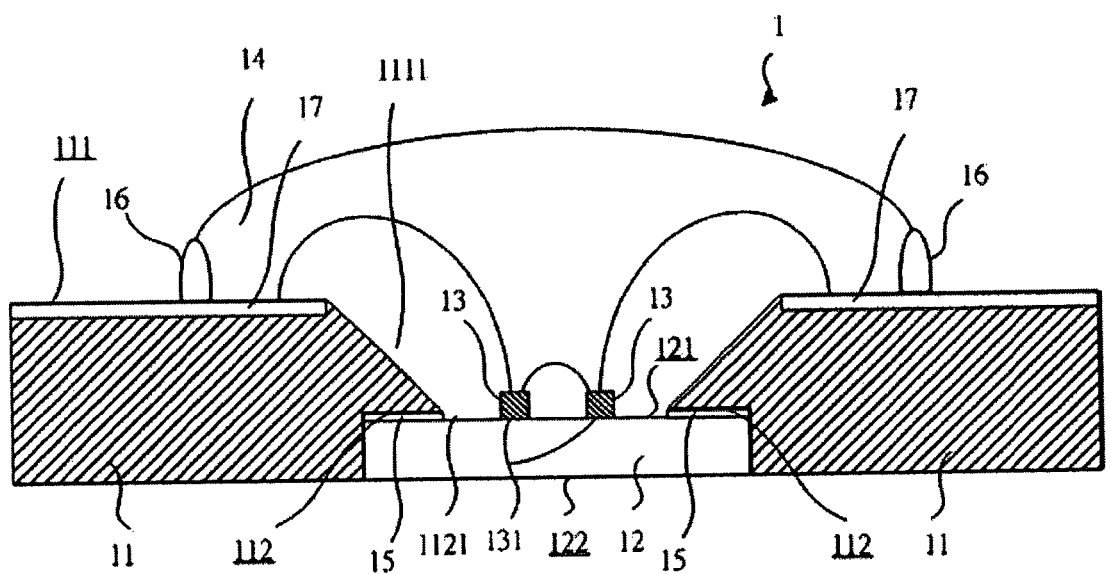
FIG. 2 is a sectional view of a semiconductor light-emitting device package structure of an embodiment of the invention.

Please refer to FIG. 2, which shows a sectional view of a semiconductor light-emitting device package structure of an embodiment of the invention. The semiconductor light-emitting device package structure 1 includes a substrate 11, a sub-mount 12, at least one semiconductor light-emitting die 13, and a package material 14. The top surface 111 of the substrate 11 has a first recess 1111, and a bottom surface 112 is defined on the substrate 11. Furthermore, a second recess 1121 is formed on the bottom surface 112 which is passed through and linked together with the first recess 1111. The sub-mount 12 is embedded in the second recess 1121, and a second surface 122 is defined on the sub-mount 12, and the first surface 121 of the sub-mount 12 is exposed in the first recess 1111, and a protrusion 16 is formed on the top surface 111 along the edge of the first recess 1111. The at least one semiconductor light-emitting die 13 has a bottom 131 which mounted to the first surface 121 of the sub-mount 12 partially exposed within the first recess 1111. The package material 14 is filled into the protrusion 16 to cover the at least one semiconductor light-emitting die 13. Moreover, the at least one semiconductor light-emitting die 13 has inner electrodes which electrically coupled to the outer electrodes 17 on the top surface 111 via wires. In the embodiment, the inner electrodes of the at least one semiconductor light-emitting die 13 is connected to the outer electrodes 17 in series. However, the connection of the electrodes can be parallel connection to reach the goal of the invention.

A heat conductive paste 15 is disposed between the first surface 121 of the sub-mount 12 and the bottom of the first recess 1111 to combine the first substrate 11 and the sub-mount 12.

Figure 3:
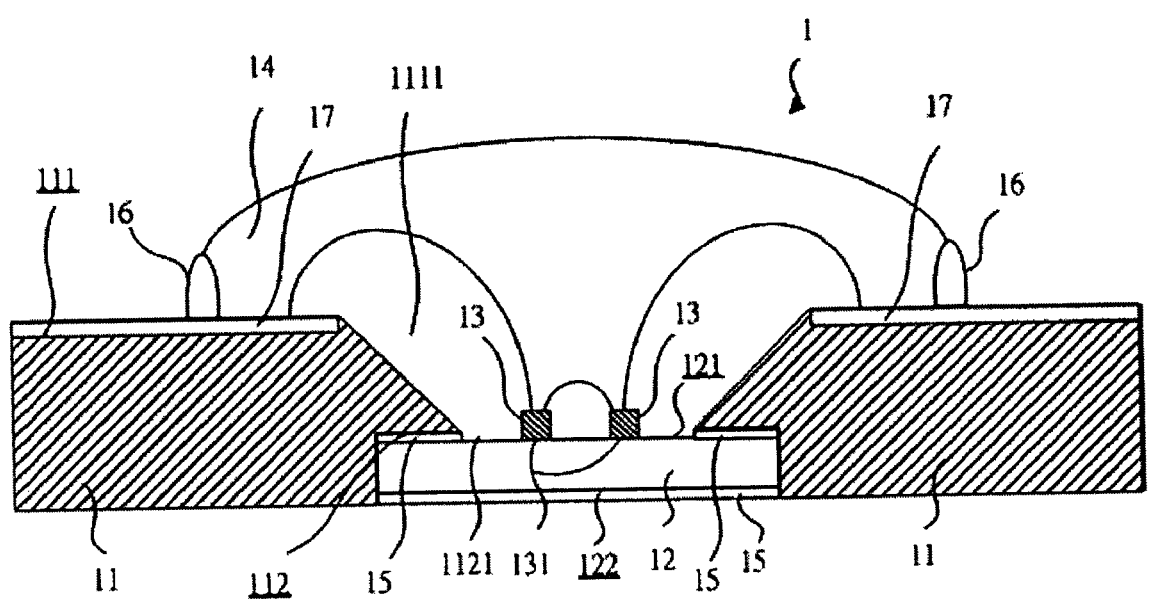
FIG. 3 is a sectional view of a semiconductor light-emitting device package structure of an embodiment of the invention.

Please refer to FIG. 3, which shows a sectional view of a semiconductor light-emitting device package structure of an embodiment of the invention. As shown in FIG. 3, the second surface 122 of the flat sub-mount 12 is parallel to the bottom surface 112 of the substrate 11. Furthermore, the heat conductive paste 15 is coated under the second surface 122 of the flat sub-mount 12, so as to allow the second surface 122 of the sub-mount 12 and the bottom surface 112 of the substrate 11 to constitute into a plane.

Figure 4:
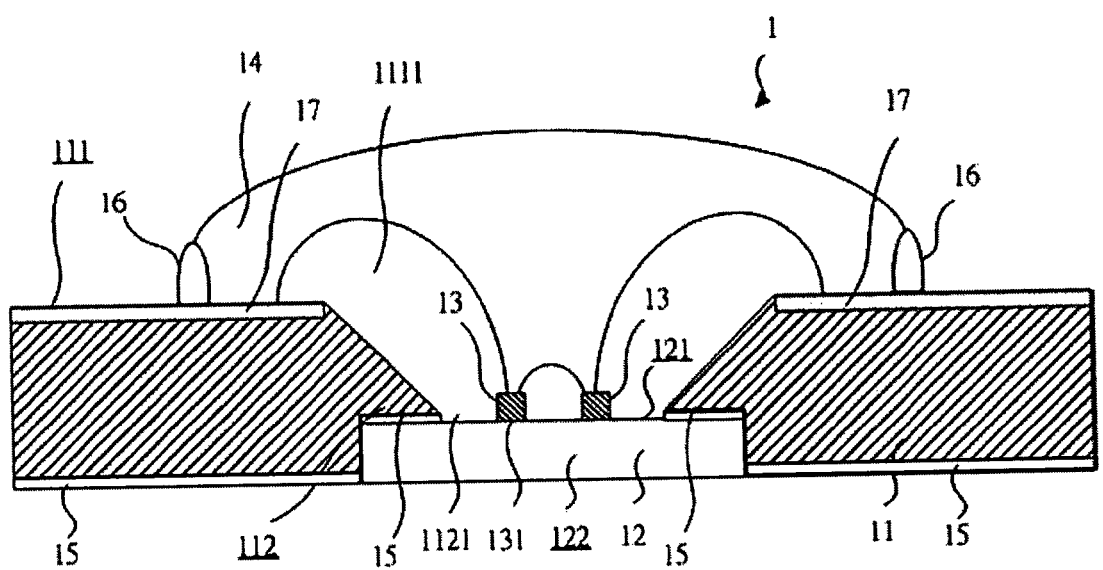
FIG. 4 is a sectional view of a semiconductor light-emitting device package structure of an embodiment of the invention.

Please refer to FIG. 4, which shows a sectional view of a semiconductor light-emitting device package structure of an embodiment of the invention. As shown in FIG. 4, the second surface 122 of the flat sub-mount 12 is parallel to the bottom surface 112 of the substrate 11. Furthermore, an heat conductive paste 15 is coated under the bottom surface 112 of the substrate 11, so as to allow the second surface 122 of the sub-mount 12 and the bottom surface 112 of the substrate 11 to constitute into a plane.

Obviously, the invention provides a package structure with high heat dissipating efficiency, and the package structure is used to package at least a semiconductor light-emitting device. Furthermore, the package structure of the invention can also be used to coordinate with a heat conducting device to further eliminate the heat generated by a high power semiconductor light emitting device, so as to solve the problem of exceeding heat resistance between the interface of the package structure and the heat dissipating module.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light-emitting device package structure, comprising:
   a substrate thereon defining a top surface and a bottom surface, a first recess being formed on the top surface, a second recess being formed on the bottom surface, and the second recess being passed through and linked together with the first recess, a protrusion being formed on the top surface along the edge of the first recess, a plurality of outer electrodes being disposed on the top surface, a shoulder is formed between the first recess and the second recess;
   a flat sub-mount constituted by silicon linking to the second recess and thereon defines a respective first surface and a respective second surface, the flat sub-mount being embedded in the second recess such that the first surface of said flat sub-mount is partially exposed within the first recess, the shoulder thereon defining a lower surface which faces toward the first surface of the flat sub-mount, an adhesion paste is coated on the shoulder to assist the bonding of the first surface of the flat sub-mount and the shoulder without electrical connection through the adhesion paste, wherein no electrode is formed on the lower surface of the shoulder and the second surface of the flat sub-mount is substantially parallel to the bottom surface of the substrate;
   a plurality of semiconductor light-emitting dies, wherein each of the semiconductor light-emitting dies comprises a bottom portion and a inter electrode, the plurality of semiconductor light-emitting dies being mounted to the first surface of the flat sub-mount partially exposed within the first recess; and
   a package material filled into the protrusion to cover the plurality of semiconductor light-emitting dies.

2. The semiconductor light-emitting device package structure of claim 1, wherein the size at the bottom of the first recess is less than the size at the top of the second recess.

3. The semiconductor light-emitting device package structure of claim 1, wherein the substrate is constituted by a metal material, a ceramic material, a flexible circuit board, or a hard circuit board.

4. The semiconductor light-emitting device package structure of claim 1, wherein the second surface of the flat sub-mount and the bottom surface constitute into a plane.

5. The semiconductor light-emitting device package structure of claim 1, wherein the at least one semiconductor light-emitting die is a white light diode.

6. The semiconductor light-emitting device package structure of claim 1, wherein the at least one semiconductor light-emitting die comprises a blue light diode.

7. The semiconductor light-emitting device package structure of claim 1, wherein the at least one semiconductor light-emitting die comprises at least one red light diode, at least one blue light diode, and at least one blue light diode.

* * * * *